US012700563B2

(12) United States Patent
Henstra et al.

(10) Patent No.: US 12,700,563 B2
(45) Date of Patent: Aug. 4, 2026

(54) ELECTROSTATIC MIRROR CHROMATIC ABERRATION CORRECTORS

(71) Applicant: FEI Company, Hillsboro, OR (US)

(72) Inventors: Alexander Henstra, Eindhoven (NL); Ali Mohammadi-Gheidari, Eindhoven (NL)

(73) Assignee: FEI Company, Hillsboro, OR (US)

( * ) Notice: Subject to any disclaimer, the term of this patent is extended or adjusted under 35 U.S.C. 154(b) by 667 days.

(21) Appl. No.: 18/083,433

(22) Filed: Dec. 16, 2022

(65) Prior Publication Data

US 2023/0215682 A1     Jul. 6, 2023

Related U.S. Application Data

(60) Provisional application No. 63/295,474, filed on Dec. 30, 2021.

(51) Int. Cl.
*H01J 37/153* (2006.01)
*H01J 37/147* (2006.01)
*H01J 37/28* (2006.01)

(52) U.S. Cl.
CPC ........ *H01J 37/153* (2013.01); *H01J 37/1477* (2013.01); *H01J 37/28* (2013.01); (Continued)

(58) Field of Classification Search
CPC ...... H01J 37/153; H01J 37/1477; H01J 37/28; H01J 2237/1516; H01J 2237/1532; H01J 2237/1534
See application file for complete search history.

(56) References Cited

U.S. PATENT DOCUMENTS 10,679,819 B2     6/2020   Kruit
2006/0016974 A1*  1/2006   Funnemann ............ H01J 37/05
                                                         250/281
(Continued)

FOREIGN PATENT DOCUMENTS

DE        102018010383 A1 *  7/2020   .............. H01J 37/28
RU            2362234 C1      7/2009

OTHER PUBLICATIONS

An electrostatic mirror, Journal of Physics E: Scientific instruments (Year: 1973).*
(Continued)

*Primary Examiner* — Georgia Y Epps
*Assistant Examiner* — Hanway Chang
(74) *Attorney, Agent, or Firm* — Leron Vandsburger

(57)                    ABSTRACT

Electrostatic mirror chromatic aberration (Cc) correctors, according to the present disclosure, comprise an electrostatic electron mirror that itself comprises a multipole. The electrostatic electron mirror is positioned within the corrector such that, when the corrector is in use, an electron beam passing through the corrector is not incident on the electrostatic electron mirror along the optical axis of the mirror. The mirror object distance of the electrostatic mirror is equal to the mirror image distance of the electrostatic mirror, and the electrostatic mirror is configured such that the electrostatic mirror applies no dispersion or coma aberration to the electron beam. The multipole is positioned in the mirror plane of the electrostatic electron mirror, and in some embodiments the multipole is a quadrupole.

20 Claims, 7 Drawing Sheets

(52) U.S. Cl.
CPC .................. *H01J 2237/1516* (2013.01); *H01J 2237/1532* (2013.01); *H01J 2237/1534* (2013.01)

(56) References Cited

U.S. PATENT DOCUMENTS

| | | | |
|---|---|---|---|
| 2008/0237463 A1 | 10/2008 | Ose et al. | |
| 2020/0258714 A1* | 8/2020 | Cook ................... | H01J 37/265 |

OTHER PUBLICATIONS

Abedzadeh et al., "Electrostatic Electron Mirror in SEM for Simultaneous Imaging of Top and Bottom Surfaces of a Sample", arxiv.org, Available online at: https://arxiv.org/pdf/2012.09902.pdf, Dec. 17, 2020, pp. 1-36.

Dohi et al., "Design for an Aberration Corrected Scanning Electron Microscope using Miniature Electron Mirrors", Ultramicroscopy, vol. 189, Jun. 2018, pp. 1-23.

Application No. EP22217129.0 , Extended European Search Report, Mailed On May 22, 2023, 8 pages.

Rempfer , "A Theoretical Study of The Hyperbolic Electron Mirror as a Correcting Element for Spherical and Chromatic Aberration in Electron Optics", Journal of Applied Physics, vol. 67, No. 10, May 1990, pp. 6027-6040.

\* cited by examiner

700

702

704

800

ELECTROSTATIC MIRROR CHROMATIC ABERRATION CORRECTORS

BACKGROUND OF THE INVENTION

Scientists and industry continue to explore our world at smaller and smaller scales. To allow such exploration, it is important that charged particle technologies continuously improve such that charged particle beam systems are able to achieve increasingly sharper resolutions. One way that the resolution of a charged particle systems can be improved is through correctors, which compensate for lens aberrations in the charged particle beam. A current type of corrector uses a single mirror with a 90-degree magnetic sector beam splitter or a double mirror in combination with beam deflectors. The beam splitter or the extra deflector are used in such systems to guarantee that the charged particle beam is incident perpendicular to the mirror so as to reduce the off-axis aberrations caused by the mirror. However, these present systems are complex, making them difficult to design, build, and align.

Another type of corrector that is currently used employs electron mirrors to reduce beam aberrations. This type of system is useful because it represents an electrostatic system that can correct aberrations, thus reducing the complexity and increasing the reliability of the correctors. An example of such a corrector is described in U.S. Pat. No. 10,679,819.

Unfortunately, aberration correctors that include inclined double mirrors are currently impractical for use in an optical system. Specifically, any electron mirror corrector that comprises double inclined mirrors must have the individual mirrors inclined at an angle of at least a few degrees in order to avoid having the charged particle beam pass out of the system within the charged particle beam striking any individual mirrors multiple times. This necessity for a large angle of inclination causes the electron mirrors of current double inclined mirror correctors to generate large off-axis aberrations in the charged particle beam. The current solution to this problem is to have the mirrors be perpendicular to the charged particle beam, and to use deflection systems or beam splitters to separate the reflected portion of the beam from the incident beam. While having the charged particle beam strike the electron mirrors along the optical axis eliminates the off-axial aberrations, these current systems are more complex, and more expensive. Furthermore, current correction systems that employ magnetic beam splitters can suffer from magnetic hysteresis of component soft-magnetic iron making the implementation of such technology not feasible. Therefore, it is desired to develop a mirror corrector system that is practical in charged particle systems without using deflection systems or beam splitters.

SUMMARY

Electrostatic mirror chromatic aberration (Cc) correctors, according to the present disclosure, comprise an electrostatic electron mirror that itself comprises a multipole. The electrostatic electron mirror is positioned within the corrector such that, when the corrector is in use, an electron beam passing through the corrector is not incident on the electrostatic electron mirror along the optical axis of the mirror. The mirror object distance of the electrostatic mirror is equal to the mirror image distance of the electrostatic mirror, and the electrostatic mirror is configured such that the electrostatic mirror applies no dispersion or coma aberration to the electron beam. The multipole is positioned in the mirror plane of the electrostatic electron mirror, and in some embodiments the multipole is a quadrupole.

Charged particle systems including electrostatic mirror Cc correctors, according to the present disclosure comprise a sample holder configured to hold a sample, a source configured to emit a charged particle beam towards a sample, an electrostatic mirror Cc corrector, a focusing column configured to direct the charged particle beam to be incident on the sample, and one or more detectors configured to detect emissions resultant from the charged particle beam being incident on the sample.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicate similar or identical items.

Figure 1:
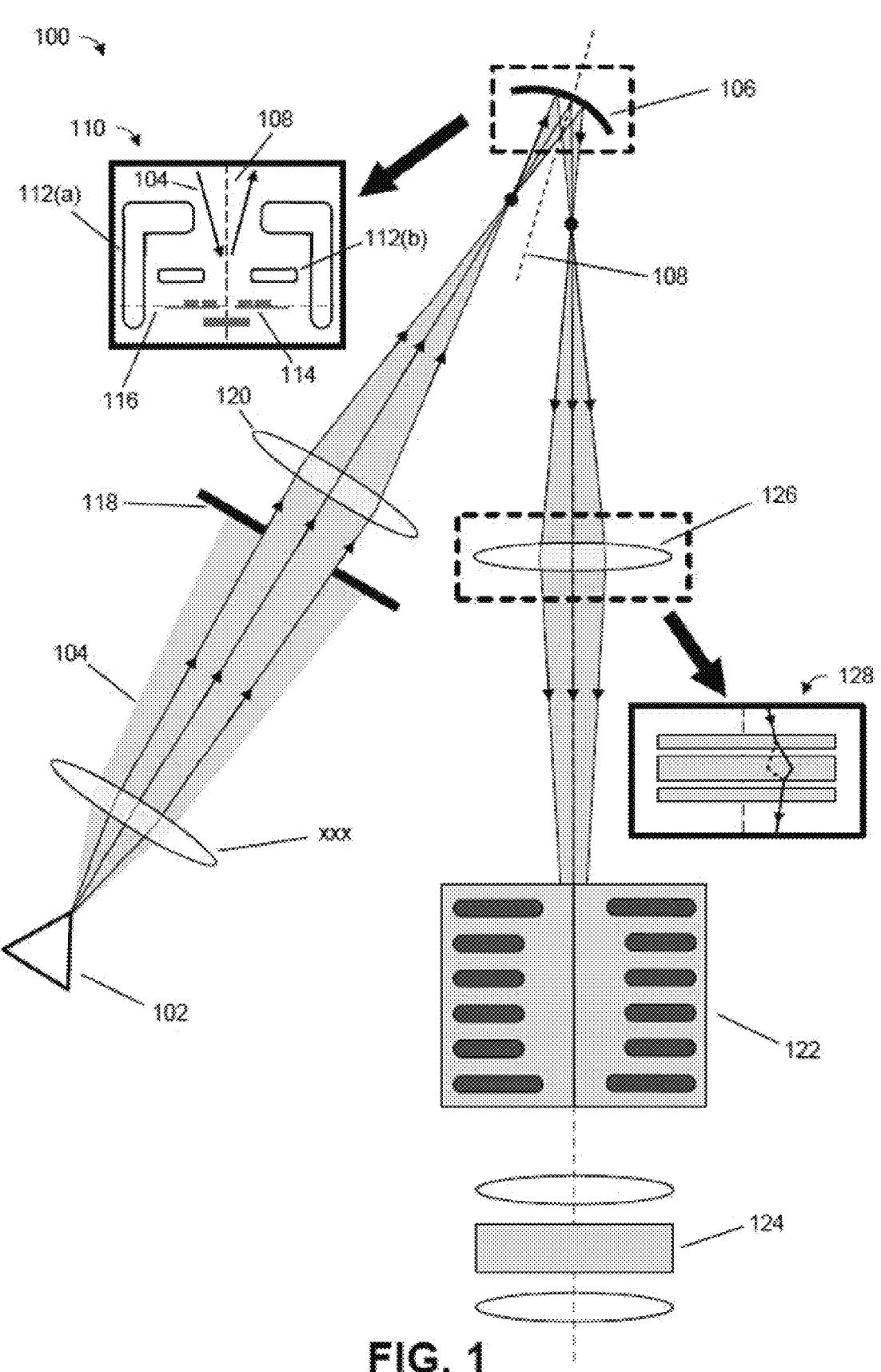
FIG. 1 illustrates example electrostatic mirror Cc correctors that comprise a single electrostatic mirror.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Electrostatic mirror chromatic aberration (Cc) correctors and charged particle systems including them, are disclosed herein. More specifically, the systems according to the present disclosure, correct for chromatic aberration by using electrostatic mirrors positioned such that charged particle beams do not strike the mirrors along their central mirror axis. For each of the electrostatic mirrors, the mirror object distance is equal to the mirror image distance. Additionally, the electrostatic mirrors each include component multipoles in the mirror plane to correct for off-axial aberrations. According to the present disclosure, a multipole corresponds to a multipole field created by a multipole element. For example, individual electrostatic mirror may include a quadrupole lens that creates a quadrupole field near the mirror plane of the electrostatic mirror. For example, the multipole field may be centered in point within 2, 5, 10, and 30 nm of the mirror plane. In this way, when the object distance of the mirrors is equal to the image distance of the mirrors, when the appropriate multipole element is located near the mirror plane (i.e., a multipole field that is optimized for the geometry of the system, the characteristics of the beam, etc.), the net dispersion, the astigmatism, and/or the coma aberration to the charged particle beams is minimized or nullified.

In systems where there are more than one electrostatic mirror, they may be positioned such that the symmetry of the mirrors cancels certain aberrations (such as angular dispersion and chromatic astigmatism) created by the charged particle beam not striking each of the mirrors along their central mirror axis. In some embodiments, the electrostatic mirror Cc correctors may further include at least two deflector systems that allow the corrector to operate in a correction mode where the charged particle beam strikes the component electrostatic mirrors of the corrector, and a bypass mode where the charged particle beam passes through the corrector without striking one or more of the electrostatic mirrors.

FIG. 1 is an illustration of example electrostatic mirror Cc correctors 100 that comprise a single electrostatic mirror. A charged particle emitter 102 (e.g., a thermal electron source, Schottky-emission source, field emission source, etc.) is shown as emitting a charged particle beam 104 (e.g., an ion beam, an electron, beam, etc.) towards an electrostatic mirror 106. According to the present invention, the electrostatic mirror 106 comprises a multipole 114 in its mirror plane. The charged particle beam 104 is shown as being incident on the electrostatic mirror 106 along a path that is not parallel to the central mirror axis 108 of the electrostatic mirror 106. The central mirror axis of an electrostatic mirror is known to one skilled in the art to be an imaginary straight line passing through the center(s) of the mirror and/or the center of the electric field generated by the mirror, and which is perpendicular to the mirror plane. A person having skill in the art would understand that a portion of a charged particle beam that does not strike an electrostatic mirror along its central mirror axis will be reflected such that the reflected portion of the beam will have one or more geometric off-axial aberrations (e.g., coma, astigmatism, etc.) applied to it by the electrostatic mirror. Because the electrostatic mirror 106 is inclined with relation to the beam path of the charged particle beam 104, the electrostatic mirror 106 also creates off-axial chromatic aberrations in the charged particle beam 104, i.e. chromatic astigmatism. While not explicitly shown in FIG. 1, the electrostatic mirror 106 is configured to have a mirror object distance that is equal to the mirror image distance of the electrostatic mirror 106. Because the mirror object distance is equal to the mirror image distance, the electrostatic mirror 106 does not add dispersion or coma aberration to the reflected portion of the charged particle beam 104. Additionally, in some embodiments, the mirror axial potential of the electrostatic mirror 106 is specifically shaped such that the electrostatic mirror 106 applies no chromatic astigmatism (or a near-zero amount of chromatic astigmatism) to the reflected portion of the charged particle beam 104. Alternatively, or in addition, the spherical aberration applied to the electron beam by the electrostatic electron mirror is zero or near zero.

Figure 7:
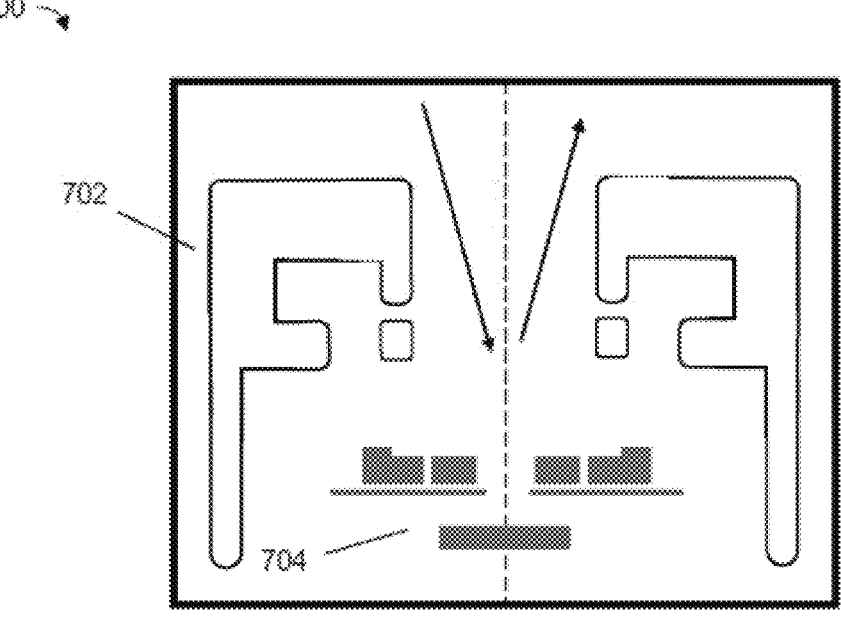
FIG. 7 illustrates a cross sectional schematic diagram of an electrostatic mirror, according to the present invention.

FIG. 1 further shows in inset schematic view 110 of the electrostatic mirror 106. The inset 110 shows the electrostatic mirror as being composed of electrodes 112(a), electrodes 112(b), and a multipole element 114. The multipole element 114 is positioned so that it generates a multipole field in or near the mirror plane 116 of the electrostatic mirror 106. In some embodiments the electrodes 112(a) may be at ground potential. Alternatively, or in addition, the geometry and/or voltage of the electrodes 112(b) may be such that they generate and/or assist the multipole element 114 in creating the multipole field at or near the mirror plane 116. FIG. 1 illustrates an embodiment of the example electrostatic mirror Cc corrector 100 where the multipole element is a pancake-like multipole array 114 which creates a quadrupole field in the mirror plane 116. Specifically, FIG. 1 shows an embodiment where the pancake multipole 114 includes two layers, with the upper layer comprising two rings, where at least one of the two rings is segmented (an example of a possible segmentation is shown in FIG. 7). The quadrupole applies a stigmatism to the charged particle beam 104 without disturbing the symmetry between the object side and image side of the electrostatic electron mirror 106. The diameter of the electrostatic electron mirror may be 3 mm or less.

FIG. 1 further illustrates an aperture 118 for selecting the current of the charged particle beam 104 that enters the example electrostatic mirror Cc correctors 106, as well as a decelerating lens 120 positioned between the aperture 118 and the electrostatic mirror 106.

FIG. 1 also shows the example electrostatic mirror Cc corrected system 100 as being positioned above an accelerator 122 and an optional spherical aberration (Cs) corrector 124. A quadrupole 126 (shown in further detail as a quadrupole triplet in inset 128) is depicted downstream of the electrostatic mirror 106.

Figure 2A:
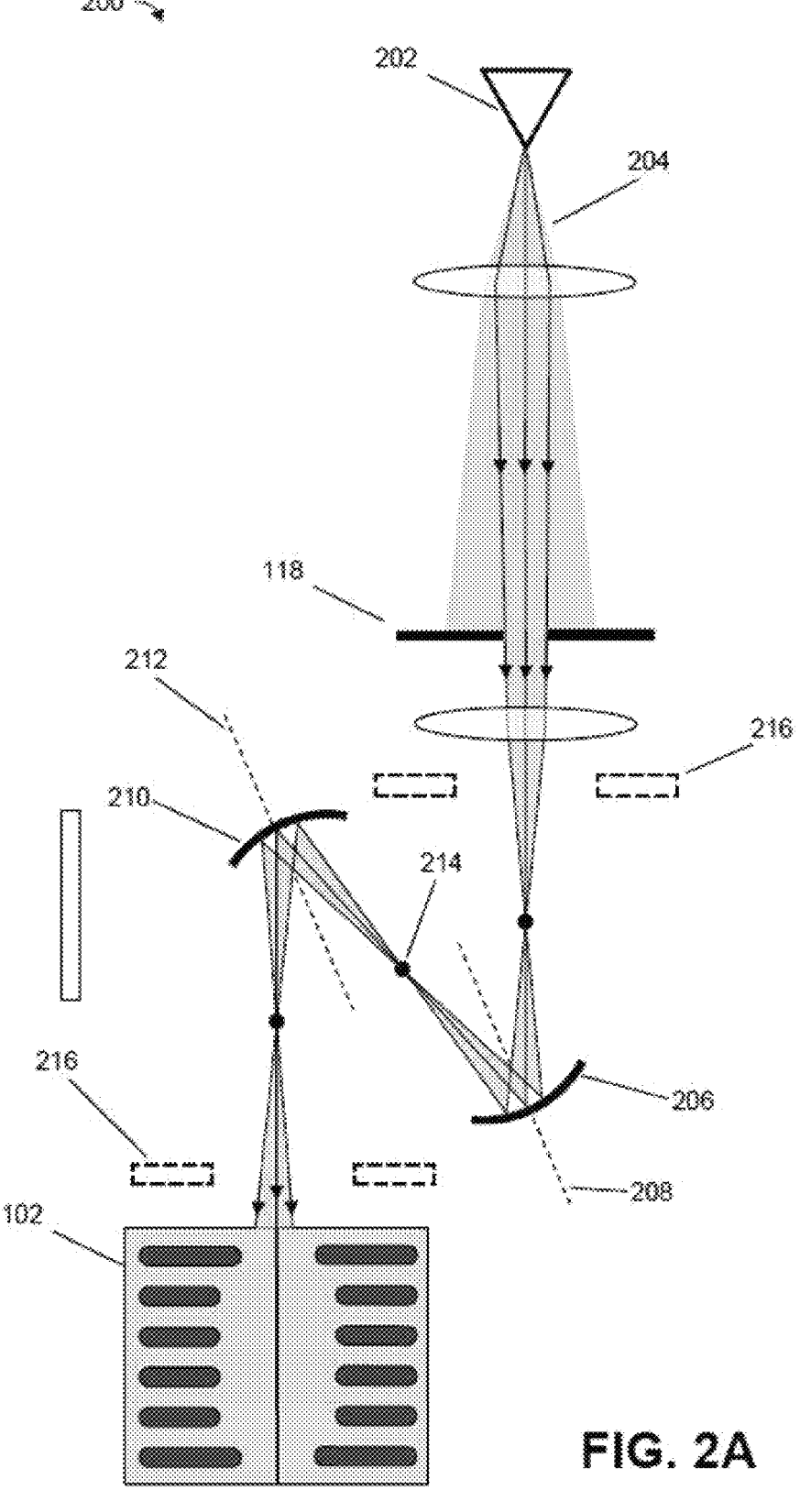
FIGS. 2A and 2B illustrate example electrostatic mirror Cc correctors comprising two electrostatic mirrors which are operating in a correction mode and a bypass mode, respectively.
Figure 2B:
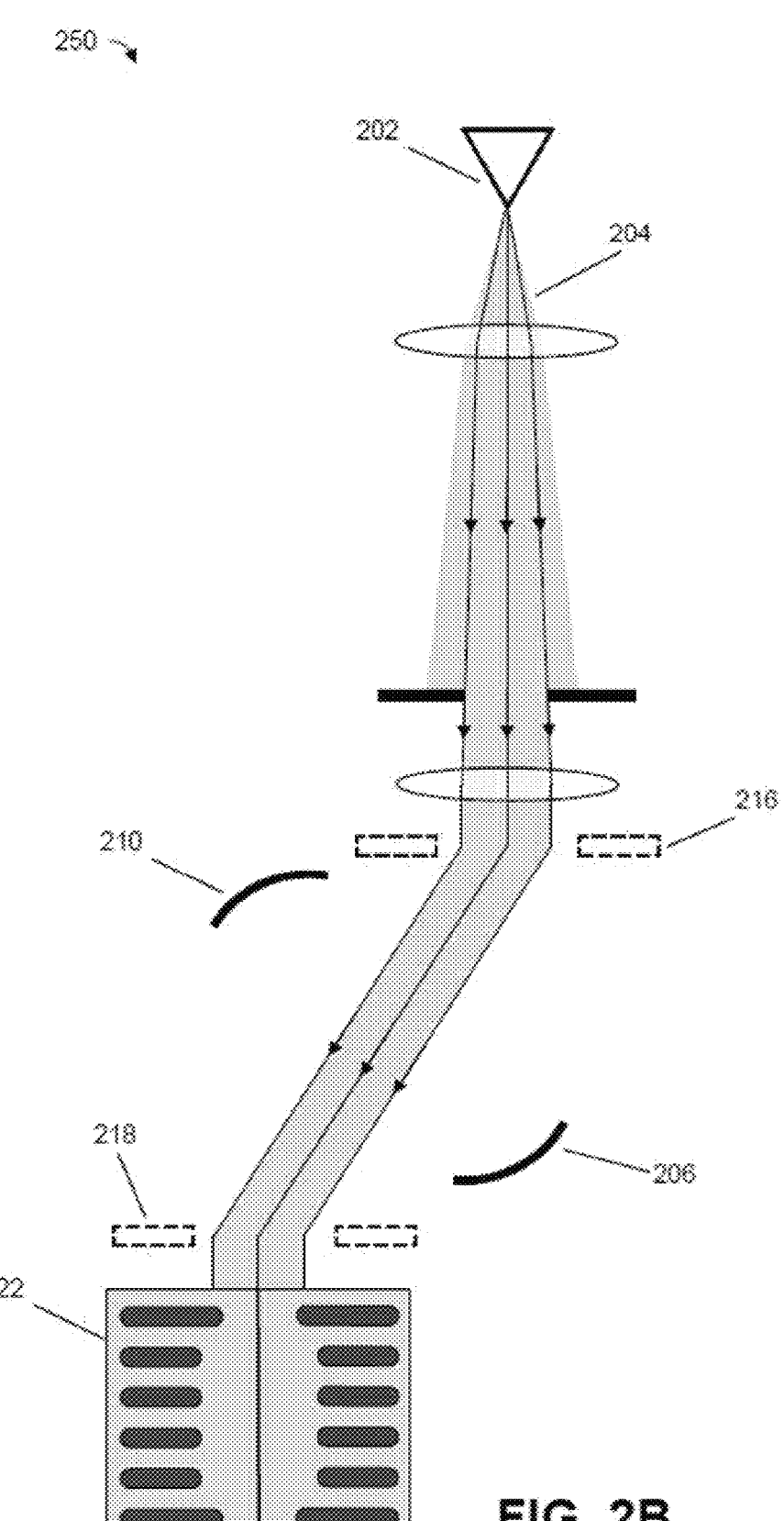

FIGS. 2A and 2B are illustrations of example electrostatic mirror Cc correctors 200 and 250 comprising two electrostatic mirrors which are operating in a correction mode and a bypass mode, respectively. FIGS. 2A and 2B show an emitter 202 (e.g., a thermal electron source, Schottky-emission source, field emission source, etc.) that is emitting a charged particle beam 204 (e.g., an ion beam, an electron, beam, etc.) towards a first electrostatic mirror 206. The charged particle beam 204 is shown as being incident on the first electrostatic mirror 206 along a path that is not parallel to its central mirror axis 208. The electrostatic mirror Cc correctors 200 are further shown as including a second electrostatic mirror 210. The second electrostatic mirror 210 is positioned such that the portion of the charged particle beam 204 that is reflected by the first electrostatic mirror 206 strikes the second electrostatic mirror along a path that is not parallel to its central mirror axis 212. According to the present invention, each of the first electrostatic mirror 206 and second electrostatic mirror 210 comprise a multipole field in their respective mirror planes For example, a multipole element with 6 electrodes may make one or more multipole fields of various types and orientations, including in some embodiments a quadrupole field. FIG. 2A shows an embodiment where the exit beam path of the charged particle beam 204 after it is reflected by the second electrostatic mirror 210 as being parallel to the initial beam path of the charged particle beam 204 before it is reflected by the first electrostatic mirror 206.

According to the present disclosure, the first electrostatic mirror 206 and the second electrostatic mirror 210 are positioned to use symmetry to correct angular dispersion. That is, the first electrostatic mirror 206 and the second electrostatic mirror 210 are positioned such that the angle at which the charged particle beam 204 is reflected by the second electrostatic mirror 210 induces second dispersion in the reflected beam that combine with the first dispersion in the charged particle beam 204 created by reflection from the first electrostatic mirror 206 such that the net dispersion in the reflected beam is corrected (i.e., is zero or near zero) when the charged particle beam 204 leaves the electrostatic mirror Cc correctors 200 and 250. For example, the first electrostatic mirror 206 may apply a first dispersion to the charged beam in an x-direction, and the second electrostatic mirror 210 may apply a second dispersion to the beam in a y-direction. Because the first and second 2dispersion are symmetric and perpendicular, when they are combined, they compensate with each other such that the final beam has no net dispersion from the mirror reflections.

Because the first electrostatic mirror 206 and second electrostatic mirror 210 are each inclined with relation to the beam path of the charged particle beam 204, the two electrostatic mirrors create off-axial Cc aberrations in the reflected portion of the charged particle beam 204. While not explicitly shown in FIG. 2A or 2B, the first electrostatic mirror 206 and the second electrostatic mirror 210 are configured to have a mirror object distance that is equal to their mirror image distance. Because the mirror object distance is equal to the mirror image distance, the electrostatic mirrors do not apply a dispersion or coma aberration to the reflected portion of the charged particle beam 204. Additionally, in some embodiments, the mirror axial potential of the first electrostatic mirror 206 and the second electrostatic mirror 210 are specifically shaped such that the electrostatic mirrors apply no chromatic astigmatism (or a near-zero amount of chromatic astigmatism) to the reflected portion of the charged particle beam 204. Alternatively, or in addition, the spherical aberration applied to the electron beam by the electrostatic electron mirrors is zero or near zero. FIGS. 2A and 2B show the charged particle beam 204 as having a crossover point 214 between the first electrostatic electron mirror 206 and the second electrostatic electron mirror 210. In some embodiments, the crossover point 214 is equidistant between the first electrostatic electron mirror 206 and the second electrostatic electron mirror 210.

FIGS. 2A and 2B further depict the example electrostatic mirror Cc correctors 200 and 250 as including a first set of deflectors 216 and a second set of deflectors 218. However, the first and second set of deflectors are optional in the example electrostatic mirror Cc correctors 200. The first set of deflectors 216 and a second set of deflectors 218 are configured to selectively deflect the charged particle beam 204 away from a first beam path (e.g., shown in FIG. 2A) where it would strike the first electrostatic mirror 206 and to a second beam path (e.g., shown in FIG. 2B) where the charged particle beam 204 to the second set of deflectors 218. For example, FIG. 2A shows the example electrostatic mirror Cc correctors 200 that are operating in correction mode. In correction mode, the first set of deflectors 216 allow the charged particle beam 204 to strike and be reflected by the first electrostatic mirror 206. FIG. 2B shows example electrostatic mirror Cc correctors 200 that are operating in bypass mode, where the first set of deflectors 216 applies a deflection to the charged particle beam 204 so that it travels to the second set of deflectors 218 without striking or being reflected by the first electrostatic electron mirror 206 or the second electrostatic electron mirror 210. When operating in bypass mode, the second set of deflectors 218 may further deflect the charged particle beam 204 so that it exits the electrostatic mirror Cc correctors 200 along the same beam path as it would if the electrostatic mirror Cc correctors 200 was operating in correction mode.

Figure 3:
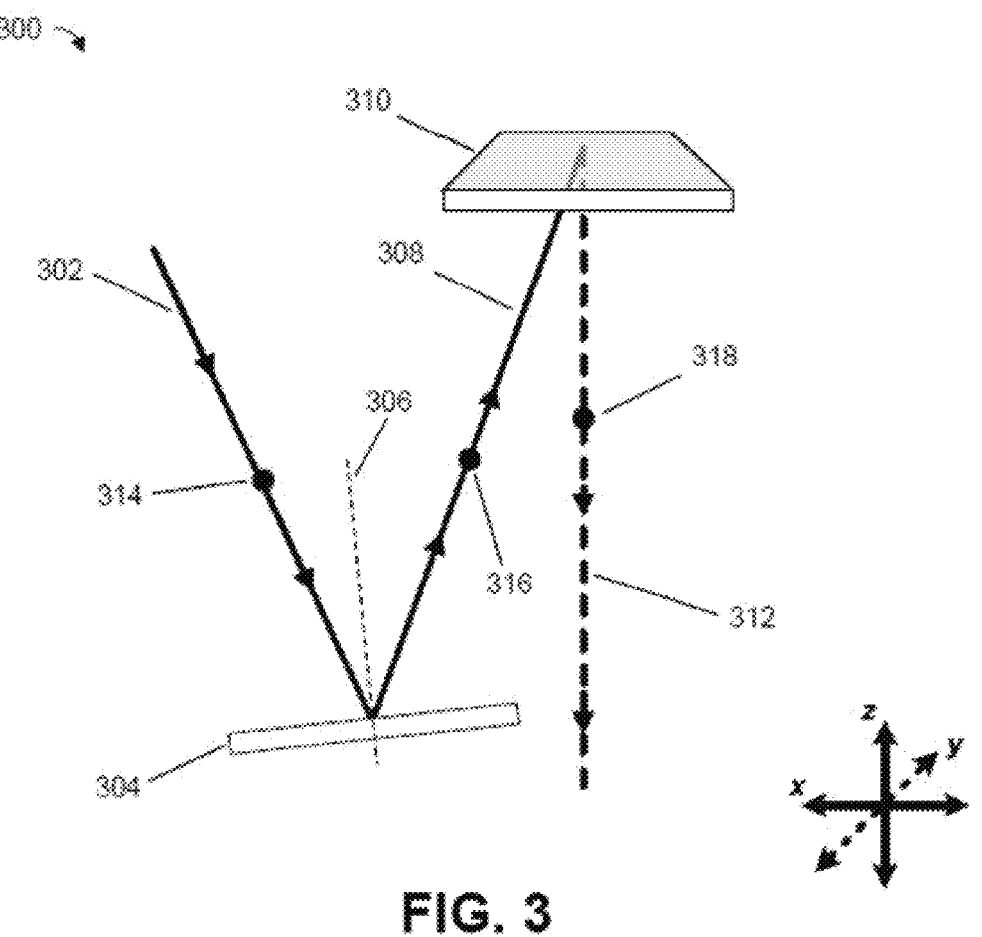
FIG. 3 illustrates an example electrostatic mirrors arrangement configured for correcting both spherical and chromatic aberrations with two electrostatic mirrors.

FIG. 3 is an illustration of an example electrostatic mirrors configuration 300 for correcting both spherical and chromatic aberrations with two electrostatic mirrors. FIG. 3 shows a first portion of a charged particle beam 302 that travels in the xz plane striking and being reflected by a first electrostatic mirror 304 comprising a multipole in its mirror plane. The first portion of the charged particle beam 302 is incident on the first electrostatic mirror 304 along a beam path that is not parallel to, or along its central mirror axis 306, such that the second portion of the charged particle beam 308 that is reflected has 2-fold aberrations in a first cylindrical direction perpendicular to its beam path. The angle between the charged particle beam 302 and the central mirror axis 306 is the same as the angle between the central mirror axis 306 and the angle between the charged particle beam 308. The second portion of the charged particle beam 308 is incident on the second electrostatic mirror 310 along a beam path that is not parallel to, or along its central mirror axis, such that the third portion of the charged particle beam 312 that is reflected has 2-fold aberrations in a second cylindrical direction perpendicular to both the first cylindrical direction and its beam path. The second electrostatic mirror 310 also comprises a multipole in its mirror plane. FIG. 3 further shows the charged particle beam as having crossover points at 314, 316, and 318.

While the first and second portions of the charged particle beam are shown as traveling in the xz plane of the image depicted in FIG. 3, the third portion of a charged particle beam 312 is shown as traveling along a path with ay axis component after it is reflected by the second electrostatic mirror 310. Specifically, FIG. 3 illustrates and embodiment where the plane through which beam 308 and beam 312 both travel is perpendicular to the xz-plane. That is, a person having skill in the art would understand that, since FIG. 3 is a 2D representation of a 3D beam path, that the first and second portions of the charged particle beam 302 travel in the plane of the image depicted, the third portion of the charged particle beam 312 travels in a path away from the viewer.

Figure 4:
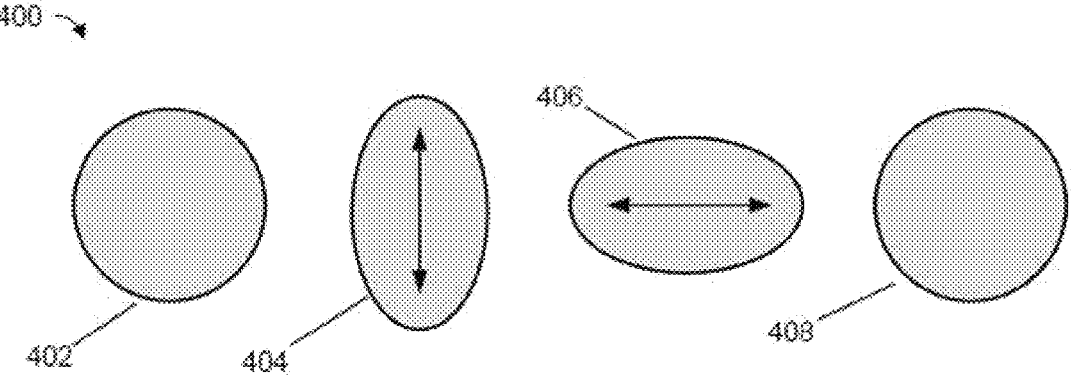
FIG. 4 illustrates an example 2-fold aberrations generated by electrostatic mirrors having a multipole in the mirror plane that illustrate the functionality of electrostatic mirror Cc correctors according to the present disclosure.

FIG. 4 is an illustration of example 2-fold aberrations 400 generated by electrostatic mirrors having a multipole in the mirror plane that illustrate the functionality of electrostatic mirror Cc correctors according to the present disclosure. Specifically, FIG. 4 shows the cross-sectional beam profile of the charged particle beam before it is reflected by a first electrostatic mirror 402, after it is reflected by the first electrostatic mirror 404, after it is reflected by a second electrostatic mirror 406, and after it is reflected by both the first electrostatic mirror and the second electrostatic mirror. As can be seen in 404, the reflection by the first electrostatic mirror causes a 2-fold aberration that elongates the beam in a first direction perpendicular to the beam path. Further, 406 shows that the reflection by the second electrostatic mirror causes a 2-fold aberration that elongates the beam in a second direction that is perpendicular to both the first direction and the beam path. Finally, 408 shows that after the charged particle beam is reflected by both the first and second electrostatic mirror, the 2-fold aberrations in the first and second direction combine to compensate for each other such that the charged particle beam is once again a circular beam. As shown in 402 and 408, in embodiments the first order optics of the charged particle beam is free of astigmatism such that their profiles are round discs both before the beam strikes the first electrostatic mirror and after the beam strikes the second electrostatic mirror.

Figure 5:
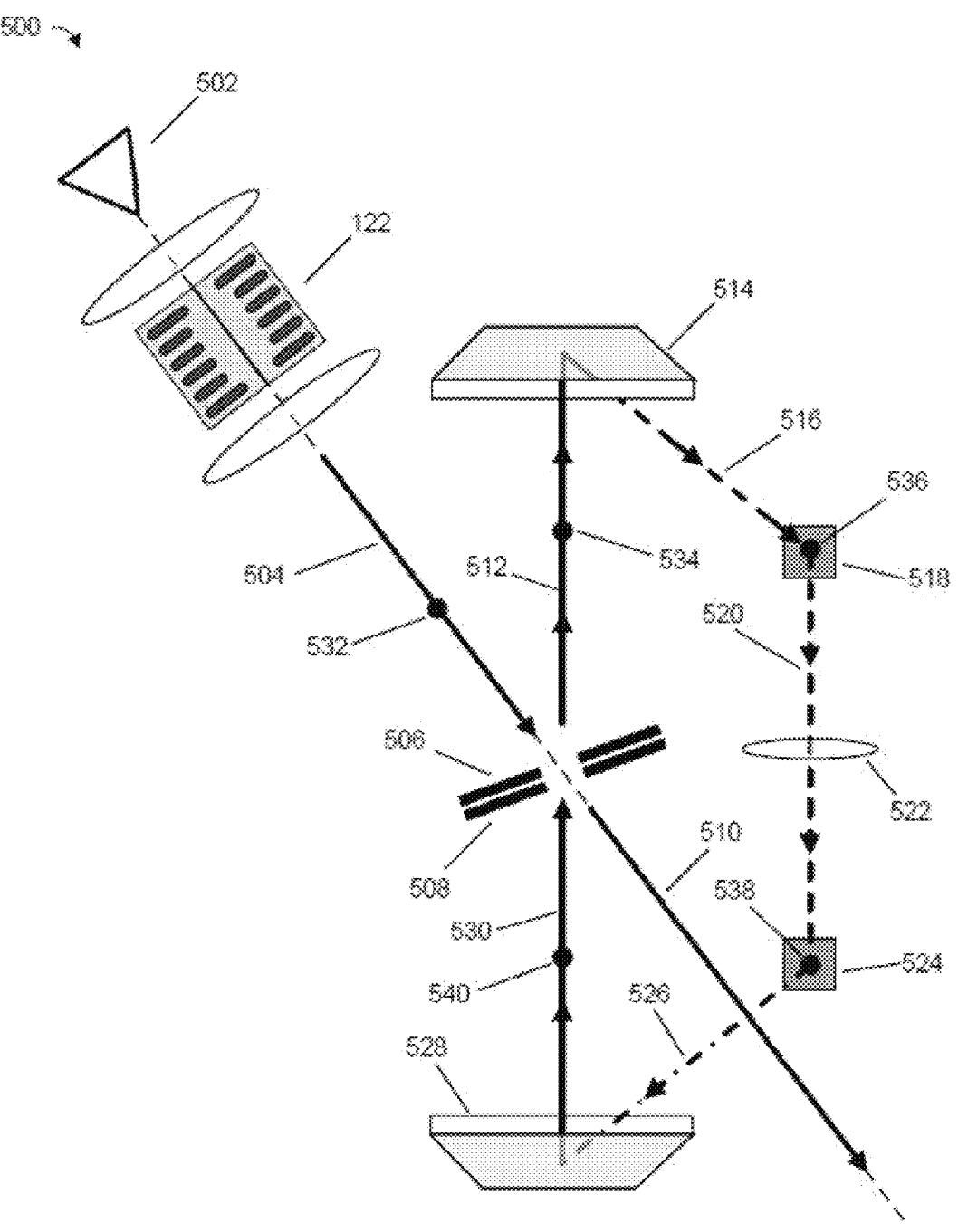
FIG. 5 illustrates example electrostatic mirror Cc correctors comprising four electrostatic mirrors which are capable of selectively switching between a correction mode of operation and a bypass mode of operation.

FIG. 5 is an illustration of example electrostatic mirror Cc correctors 500 comprising four electrostatic mirrors which are capable of selectively switching between a correction mode of operation and a bypass mode of operation. A charged particle emitter 502 (e.g., a thermal electron source, Schottky-emission source, field emission source, etc.) is shown as emitting a charged particle beam 504 (e.g., an ion beam, an electron, beam, etc.) through an accelerator 122 and towards a first electrostatic mirror 506.

The first electrostatic mirror 506 and a second electrostatic mirror 508 are shown as being parallel next to each other and facing opposite directions. When the example electrostatic mirror Cc correctors 500 is operating in bypass mode, the charged particle beam 504 is allowed to pass through the first electrostatic mirror 506 and a second electrostatic mirror 508 without being reflected. Specifically, because each electrostatic electron mirror reflects the charged particle beam 504 by generating an electric field that alters the path of electrons/charged particles such that they are reflected away from the electrostatic electron mirror without the electrons striking anything, when the first electrostatic mirror 506 and a second electrostatic mirror 508 are turned off, they do not generate their respective electric fields, and the charged particle beam 504 is allowed to pass through them along a beam exit path 510.

Alternatively, when the first electrostatic mirror 506 and a second electrostatic mirror 508 are turned on, the charged particle beam 504 is reflected by the first electrostatic mirror 506 so that it follows a first reflected beam path 512 towards a third electrostatic mirror 514, which reflects the charged particle beam 504 so that if follows a second reflected beam path 516 towards a first deflector system 518.

The first deflector system 518 deflects the charged particle beam 504 along a first deflected path 520 through a small lens 522 and to a second deflector system 524. The small lens 522 images the deflectors on to each other, and may be, in various embodiments a small Einzel lens, one or more MEMs devices, multipoles (e.g., quadrupoles), or a combination thereof. The second deflector system 524 applies a second deflection to the charged particle beam 504 such that it follows a second deflected path 526 to a fourth electrostatic lens 528 that reflects the charged particle beam 504 along a third reflected path 530 towards the second electrostatic lens 508. The second electrostatic lens 508 then reflects the charged particle beam 504 so that it exits the example electrostatic mirror Cc correctors 500 along the beam exit path 510.

According to the present invention, each of the electrostatic mirrors comprises a multipole in its respective mirror plane. For example, each of the electrostatic lenses may comprise a quadrupole field in their respective mirror plane or above. Additionally, for each of the electrostatic mirrors, the charged particle beam 504 is shown as being incident on the electrostatic mirror along a path that is not parallel to the mirror's central mirror axis. While not explicitly shown in FIG. 5, the electrostatic mirrors are each configured to have a mirror object distance that is equal to the mirror image distance. Because the mirror object distance is equal to the mirror image distance, the electrostatic mirror does not apply a dispersion or coma aberration to the portions of the charged particle beam 504 they reflect. Additionally, in some embodiments, the mirror axial potential of the electrostatic mirrors may be specifically shaped such that the electrostatic mirrors apply no chromatic astigmatism (or a near-zero amount of chromatic astigmatism) to the reflected portion of the charged particle beam. Alternatively, or in addition, the spherical aberration applied to the electron beam by the electrostatic electron mirror is zero or near zero. FIG. 5 further shows the charged particle beam as having crossover points at 532, 534, 536, 538, and 540.

Figure 6:
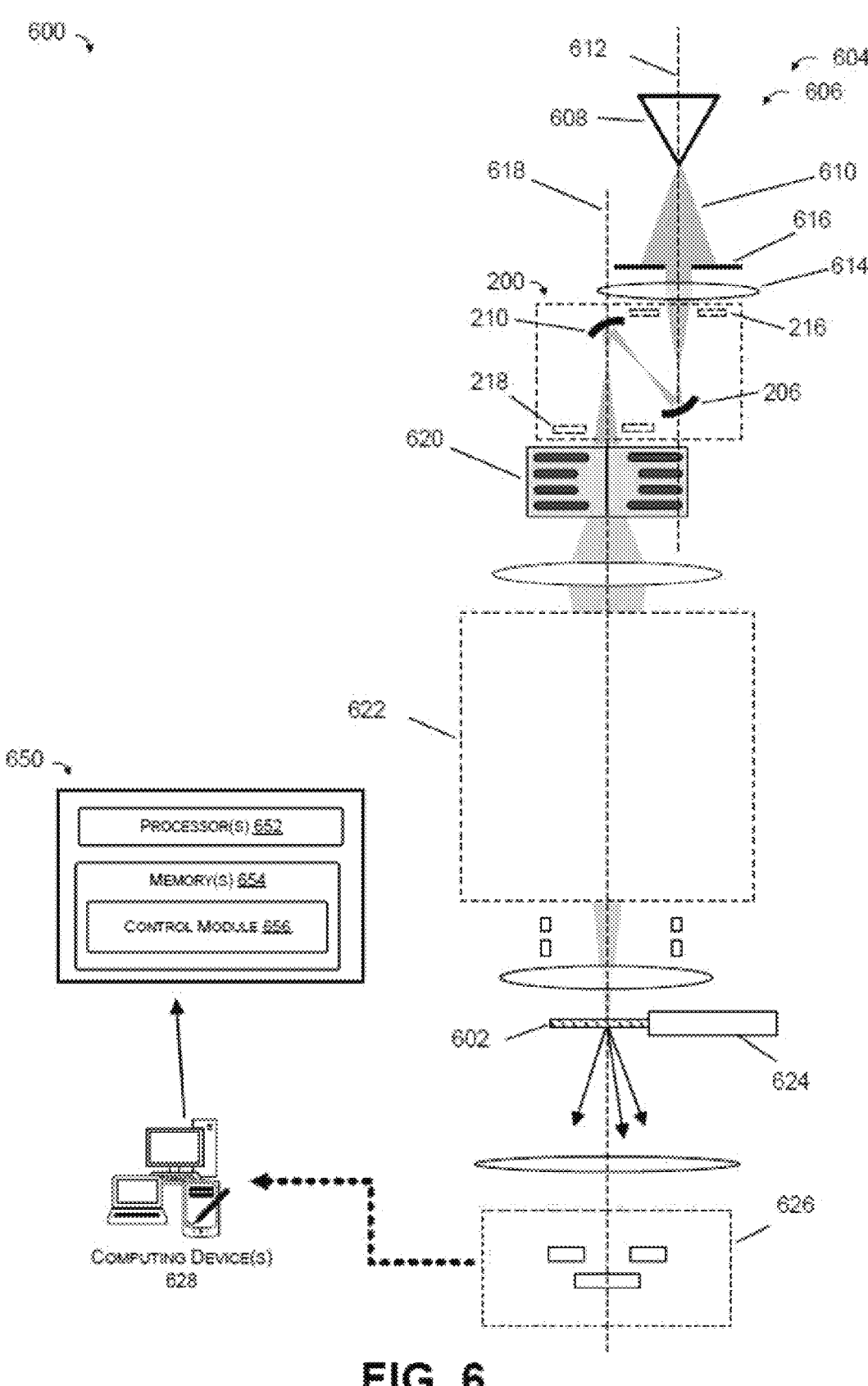
FIG. 6 illustrates an example environment for investigating a sample with example electrostatic mirror Cc correctors, according to the present invention.

FIG. 6 is an illustration of example environment 600 for investigating a sample 602 with example electrostatic mirror Cc correctors, according to the present invention. Specifically, FIG. 6 shows example environment 600 as including example electrostatic mirror Cc correctors comprising two electrostatic mirrors which are operating in a correction mode and a bypass mode, respectively.

The example charged particle system(s) 604 may be or include one or more different types of optical, and/or charged particle microscopes, such as, but not limited to, a scanning electron microscope (SEM), a scanning transmission electron microscope (STEM), a transmission electron microscope (TEM), a charged particle microscope (CPM), a cryo-compatible microscope, focused ion beam microscope (FIBs), dual beam microscopy system, or combinations thereof. FIG. 6 shows the example charged particle microscope system(s) 604 as being a scanning transmission electron microscope ((S)TEM) 606.

The example charged particle microscope system(s) 604 includes a charged particle source 608 (e.g., a thermal electron source, Schottky-emission source, field emission source, etc.) that emits an electron beam 610 along an emission axis 612 and towards a transmission electron lens 614. The emission axis 612 is a central axis that runs along the length of the example charged particle microscope system(s) 604 from the charged particle source 608 and through the transmission electron lens 614.

FIG. 6 further illustrates the example charged particle system(s) 604 as including an example electrostatic mirror Cc corrector 200 comprising two electrostatic mirrors which is capable of operating in a correction mode and a bypass mode. Specifically, FIG. 6 illustrates the example electrostatic mirror Cc corrector 200 in a correction mode of operation. FIG. 6 further illustrates an aperture 616 for selecting the current of the charged particle beam 610 that enters the example electrostatic mirror Cc corrector 200.

The charged particle beam 610 is shown as entering the example electrostatic mirror Cc corrector 200 and being incident on a first electrostatic mirror 206 and a second electrostatic mirror 210. The charged particle beam 610 is shown as being incident on each of the electrostatic mirrors along a path that is both different from and not parallel to their respective central mirror axis. According to the present invention, each of the electrostatic mirrors comprises a multipole in its respective mirror plane (e.g., a quadrupole). While not explicitly shown in FIG. 6, the electrostatic mirrors are each configured to have a mirror object distance that is equal to the mirror image distance. Because the mirror object distance is equal to the mirror image distance, the electrostatic mirror does not apply a dispersion or coma aberration to the portions of the charged particle beam 610 they reflect.

In some embodiments, the mirror axial potential of the electrostatic mirrors may be specifically shaped such that the electrostatic mirrors apply no chromatic astigmatism (or a near-zero amount of chromatic astigmatism) to the reflected portion of the charged particle beam.

According to the present disclosure, the first electrostatic mirror 206 and the second electrostatic mirror 210 are positioned to use symmetry to correct 2-fold aberrations. That is, the first electrostatic mirror 206 and the second electrostatic mirror 210 are positioned such that the angle at which the charged particle beam 610 is reflected by the second electrostatic mirror 210 induces second 2-fold aberrations in the reflected beam that combine with the first 2-fold aberrations in the charged particle beam 610 created by reflection from the first electrostatic mirror 206 such that the net 2-fold aberrations in the reflected beam is corrected (i.e., is zero or near zero) when the charged particle beam 610 leaves the electrostatic mirror Cc correctors 200.

FIG. 6 further depicts the example electrostatic mirror Cc corrector 200 as including a first set of deflectors 216 and a second set of deflectors 218. The first set of deflectors 216 and the second set of deflectors 218 are configured to selectively deflect the charged particle beam 610 away from a first beam path where it would strike the first and second electrostatic mirrors and onto a second beam path (e.g., shown in FIG. 2B) toward the second set of deflectors 218. In this way, a user can selectively switch the example electrostatic mirror Cc corrector 200 between a corrective mode of operation and a bypass mode of operation.

A transmission axis 618 is a central axis that runs along the path of the charged particle beam 610 as it leaves the example electrostatic mirror Cc corrector 200, and which extends through to the sample 602. An accelerator lens 620 is shown as being positioned between the example electrostatic mirror Cc corrector 200 and a focusing column 622. The focusing column 622 focuses the electron beam 610 so that it is incident on at least a portion of the sample 602. In some embodiments, the focusing column 616 may include one or more of an aperture, scan coils, and upper condenser lens. The focusing column focuses electrons from the electron source into a small spot on the sample. Different locations of the sample 602 may be scanned by adjusting the electron beam direction via the scan coils. Additionally, the focusing column 616 may correct and/or tune aberrations (e.g., geometric aberrations, chromatic aberrations) of the electron beam 610.

FIG. 6. shows the example charged particle microscope system(s) 604 as including a sample holder 624 and a microscope detector system 626. The sample holder 624 is configured to hold the sample 602, and can translate, rotate, and/or tilt the sample 602 in relation to the example charged particle microscope system(s) 604. The microscope detector system 626 is illustrated as including a disk-shaped bright field detector and dark field detector(s). In some embodiments, the microscope detector system 626 may include one or more other detectors. Alternatively, or in addition, the microscope detector system 626 may include a scanning electron microscope detector system, a focused ion beam detector system, a scanning electron microscope secondary electron detector system, a focused ion beam secondary electron detector system, and an optical microscope detector system.

FIG. 6 further illustrates the example charged particle microscope system(s) 604 as further including a computing device(s) 628. FIG. 6 further includes a schematic diagram illustrating an example computing architecture 650 of the computing devices 628. Example computing architecture 650 illustrates additional details of hardware and software components that can be used to implement the techniques described in the present disclosure. Persons having skill in the art would understand that the computing architecture 650 may be implemented in a single computing device 628 or may be implemented across multiple computing devices. For example, individual modules and/or data constructs depicted in computing architecture 650 may be executed by and/or stored on different computing devices 628. In this way, different process steps of the inventive method according to the present disclosure may be executed and/or performed by separate computing devices 628.

In the example computing architecture 650, the computing device includes one or more processors 652 and memory 654 communicatively coupled to the one or more processors 652. The example computing architecture 650 can include a control module 656 stored in the memory 654. As used herein, the term "module" is intended to represent example divisions of executable instructions for purposes of discussion and is not intended to represent any type of requirement or required method, manner, or organization. Accordingly, while various "modules" are described, their functionality and/or similar functionality could be arranged differently (e.g., combined into a fewer number of modules, broken into a larger number of modules, etc.). Further, while certain functions and modules are described herein as being implemented by software and/or firmware executable on a processor, in other instances, any or all of modules can be implemented in whole or in part by hardware (e.g., a specialized processing unit, etc.) to execute the described functions. As discussed above in various implementations, the modules described herein in association with the example computing architecture 650 can be executed across multiple computing devices 628.

The control module 656 can be executable by the processors 652 to cause a computing device 628 and/or example charged particle microscope system(s) 604 to take one or more actions. For example, the control module 628 may cause the example charged particle microscope system(s) 604 to cause the sample holder 624 to apply a translation, tilt, rotation, or a combination thereof. Additionally, the control module 628 may cause the charged particle emitter 608 to emit the electron beam 610.

In some embodiments, the control module 656 may be further configured to cause a computing device 628 to adjust one or more optical characteristics of optical elements (e.g., position, orientation, mode of operation, applied voltages, etc.) in the example charged particle microscope system(s) 604 or components thereof. For example, the control module 656 may adjust the optical characteristics of or other components of the example charged particle microscope system(s) 604 (e.g., components of the focusing column 622, an objective lens, transfer lens(es), deflectors, an accelerator lens, etc., or a combination thereof) so that the combined spherical aberration, coma, and/or astigmatism, in the electron beam 610 at the sample 602 is corrected. The control module 656 may be further configured to cause one or more of the first set of deflectors 216 and the second set of deflectors 218 are configured to selectively deflect the charged particle beam 610 away from a first beam path where it would strike the first and second electrostatic mirrors and onto a second beam path toward the second set of deflectors 218. In this way, the control module 656 can selectively switch the example electrostatic mirror CC corrector 200 between a corrective mode of operation and a bypass mode of operation.

As discussed above, the computing devices 628 include one or more processors 652 configured to execute instructions, applications, or programs stored in a memory(s) 654 accessible to the one or more processors. In some examples, the one or more processors 652 may include hardware processors that include, without limitation, a hardware central processing unit (CPU), a graphics processing unit (GPU), and so on. While in many instances the techniques are described herein as being performed by the one or more processors 652, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories 654 accessible to the one or more processors 352 are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory 654 and other storage devices for purposes of memory management and data integrity. Alternatively, in other implementations, some or all the software components may execute in memory on another device and communicate with the computing devices 628. Some or all of the system components or data structures may also be stored (e.g., as instructions or structured data) on anon-transitory, computer accessible medium or a portable article to be read by an appropriate drive, various examples of which are described above. In some implementations, instructions stored on a computer-accessible medium separate from the computing devices 628 may be transmitted to the computing devices 628 via transmission media or signals such as electrical, electromagnetic, or digital signals, conveyed via a communication medium such as a wireless link. Various implementations may further include receiving, sending, or storing instructions and/or data implemented in accordance with the foregoing description upon a computer-accessible medium.

FIG. 7 is a cross-sectional schematic diagram 700 of an electrostatic mirror, according to the present invention. The electrostatic mirror is composed of electrodes 702 and a multipole 704. The multipole is positioned such that the multipole field is in the mirror plane of the electrostatic mirror 700. FIG. 7 illustrates an embodiment where the multipole is a pancake multipole array which creates a quadrupole field in the mirror plane. The quadrupole applies a stigmatism to the charged particle beam without disturbing the symmetry between the object side and image side of the electrostatic electron mirror. The diameter of the electrostatic electron mirror may be 3 mm or less. In some embodiments, other multipoles may be included in the example electrostatic mirror 700 to zero or otherwise correct for other parasitic aberrations of the system.

Figure 8:
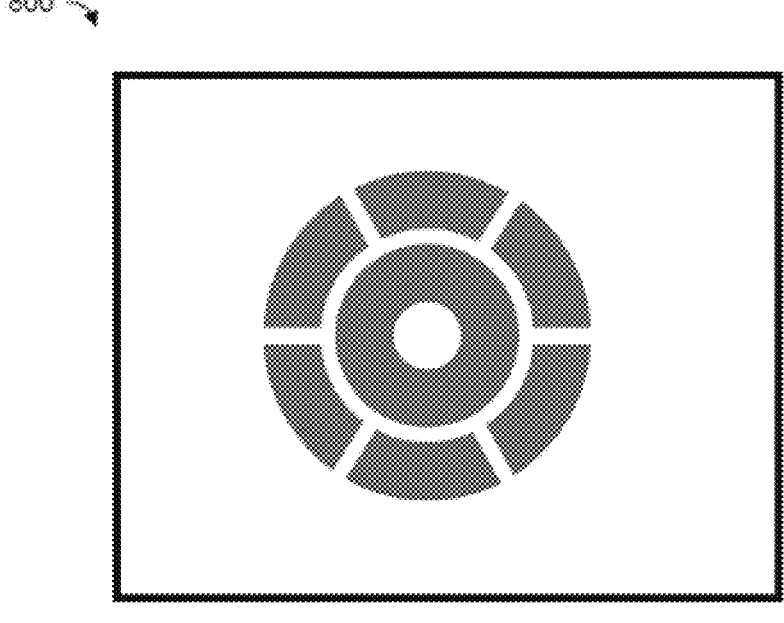
FIG. 8 illustrates an example pancake multipole mirror for creating a multipole field in the mirror plane of an example electrostatic mirror, according to the present invention.

FIG. 8 is an example layer 800 of a pancake multipole mirror for creating a multipole field in the mirror plane of an example electrostatic mirror, according to the present invention. Specifically, FIG. 8 shows an example layer of a pancake multipole mirror that contains two rings, with the outer ring segmented into six segments. In this way, the example multipole 800 is configured to cause a quadrupole field to be present in the mirror plane of an example electrostatic mirror. This quadrupole field is able to stigmate the incident beam without disturbing the mirror's symmetry between the object side and image side. The ring voltages may also be used to shape the axial mirror potential so that the chromatic aberration is equal for perpendicular directions.

Examples of inventive subject matter according to the present disclosure are described in the following enumerated paragraphs.

A1. An electrostatic mirror chromatic aberration (Cc) corrector, the corrector comprising: an electrostatic electron mirror comprising a multipole; and wherein the electrostatic electron mirror is positioned within the corrector such that, when the corrector is in use, an electron beam passing through the corrector is not incident on the electrostatic electron mirror along the optical axis of the mirror.

A1.1. The electrostatic mirror Cc corrector of paragraph A1, wherein the mirror object distance of the electrostatic mirror is equal to the mirror image distance of the electrostatic mirror.

A1.1.1 The electrostatic mirror Cc corrector of paragraph A1.1, wherein the electrostatic mirror is configured such that the electrostatic mirror applies no dispersion or coma aberration to the electron beam.

A1.2. The electrostatic mirror Cc corrector of any of paragraphs A1-A1.1.1, wherein the mirror axial potential of the electrostatic mirror is specifically shaped such that the electrostatic mirror applies no chromatic astigmatism to the electron beam.

A1.3. The electrostatic mirror Cc corrector of any of paragraphs A1-A1.2, wherein the multipole is positioned in the mirror plane of the electrostatic electron mirror.

A1.3.1. The electrostatic mirror Cc corrector of paragraph A1.1, wherein the mirror plane of the electrostatic electron mirror corresponds to a plane at or near the surface of a pancake multipole.

A1.4. The electrostatic mirror Cc corrector of any of paragraphs A1-A1.3, wherein a decelerating electron lens placed upstream of the corrector when used in a charged particle system.

A1.5. The electrostatic mirror Cc corrector of any of paragraphs A1-A1.4, wherein an aperture is placed upstream of the corrector when used in a charged particle system, the aperture configured to select the current of the electron beam that is to enter the corrector.

A1.6. The electrostatic mirror Cc corrector of any of paragraphs A1-A1.5, wherein the electrostatic mirror Cc corrector is positioned upstream of an accelerator when used in a charged particle system, such that a chromatic aberration of the electron beam is corrected before the electron beam is accelerated by the accelerator.

A1.7. The electrostatic mirror Cc corrector of any of paragraphs A1-A1.6, wherein a quadruple triplet is positioned downstream of the electrostatic mirror when the when the corrector is in use.

A1.8. The electrostatic mirror Cc corrector of any of paragraphs A1-A1.7, wherein the electron beam is incident to the electrostatic mirror along a different path than the electron beam is reflected.

A1.9. The electrostatic mirror Cc corrector of any of paragraphs A1-A1.8, wherein the electrostatic mirror Cc corrector dose not comprise a beam splitter.

A1.10. The electrostatic mirror Cc corrector of any of paragraphs A1-A1.9 wherein the chromatic astigmatism applied to the electron beam by the electrostatic electron mirror is zero or near zero.

A1.11. The electrostatic mirror Cc corrector of any of paragraphs A1-A1.10, wherein the spherical aberration applied to the electron beam by the electrostatic electron mirror is zero or near zero.

A2. The electrostatic mirror Cc corrector of any of paragraphs A1-A1.11, wherein the electrostatic electron mirror generates and electric fields that alters the path of electrons such that they are reflected away from the electrostatic electron mirror without the electrons striking anything.

A2.1. The electrostatic mirror Cc corrector of paragraph A2, wherein the electrostatic electron mirror comprises a MEMS device.

A2.2. The electrostatic mirror Cc corrector of any of paragraphs A2-A2.1 wherein the electrostatic electron mirror is a pancake multipole mirror.

A2.2.1 The electrostatic mirror Cc corrector of paragraph A2.2, wherein the electrostatic electron mirror comprises two or more rings.

A2.2.1.1. The electrostatic mirror Cc corrector of paragraph A2.2.1, wherein at least one ring of the two or more rings is segmented.

A2.3. The electrostatic mirror Cc corrector of any of paragraphs A2-A2.2.1.1 wherein the multipole is a quadrupole.

A2.3.1. The electrostatic mirror Cc corrector of paragraph A2.3, wherein the quadrupole applies a stigmatism to the electron beam without disturbing the symmetry between the object side and image side of the electrostatic electron mirror.

A2.4. The electrostatic mirror Cc corrector of any of paragraphs A2-A2.3.1 wherein the diameter of the electrostatic electron mirror is 3 mm or less.

A3. The electrostatic mirror Cc corrector of any of paragraphs A1-A2.4 wherein the electrostatic electron mirror is a first electrostatic electron mirror, the multipole is a first multipole, and the corrector further comprise a second electrostatic electron mirror comprising a second multipole.

A3.1. The electrostatic mirror Cc corrector of paragraph A3, wherein the mirror object distance of the electrostatic mirror is equal to the mirror image distance of the electrostatic mirror.

A3.1.1. The electrostatic mirror Cc corrector of paragraph A3.1, wherein the electrostatic mirror is configured such that the electrostatic mirror applies no dispersion or coma aberration to the electron beam.

A3.2. The electrostatic mirror Cc corrector of any of paragraphs A3-A3.1.1, wherein the second electrostatic electron mirror is positioned within the corrector such that, when the corrector is in use, the electron beam passing through the corrector is not incident on the second electrostatic electron mirror along the optical axis of the second electrostatic electron mirror.

A3.3. The electrostatic mirror Cc corrector of any of paragraphs A3-A3.2, wherein the electron beam has a crossover point between the first electrostatic electron mirror and the second electrostatic electron mirror.

A3.3.1. The electrostatic mirror Cc corrector of paragraph A3.3, wherein the crossover point is equidistance between the first electrostatic electron mirror and the second electrostatic electron mirror.

A3.4. The electrostatic mirror Cc corrector of any of paragraphs A3-A3.3.1, wherein the second electrostatic electron mirror is positioned downstream of the first electrostatic electron mirror when the corrector is in use.

3.4.1. The electrostatic mirror Cc corrector of paragraph A3.4, wherein the electron beam travels along a reflected beam path after it is reflected by the first electrostatic electron mirror, where the reflected beam path is such that the electron beam is incident on the second electrostatic electron mirror.

A3.4.2. The electrostatic mirror Cc corrector of any of paragraphs A3.4-A3.4.1, wherein the exit beam path of the electron beam after it is reflected by the second electrostatic electron mirror is parallel to the initial beam path of the electron beam before it is reflected by the first electrostatic electron mirror.

A3.5. The electrostatic mirror Cc corrector of any of paragraphs A3-A3.4.2, wherein the first electrostatic electron mirror and the second electrostatic electron mirror are positioned to use symmetry to correct 2-fold aberrations.

A3.6. The electrostatic mirror Cc corrector of any of paragraphs A3-A3.5, wherein the corrector further comprises a first set of deflectors and a second set of deflectors.

A3.6.1. The electrostatic mirror Cc corrector of paragraph A3.6, wherein the first set of deflectors is configured to selectively deflect the electron beam away from a first beam path where it would strike the first electrostatic electron mirror and to a second beam path where the electron beam travels to the second set of deflectors.

A3.6.2. The electrostatic mirror Cc corrector of any of paragraphs A3.6-A3.6.1, wherein the second set of deflectors are configured to selectively deflect the electron beam away from the second beam path and to a third beam path.

A3.6.3. The electrostatic mirror Cc corrector of any of paragraphs A3.6-A3.6.2, wherein the third beam path is the same as the exit beam path, where the electron beam travels to the second set of deflectors.

A3.6.4. The electrostatic mirror Cc corrector of any of paragraphs A3.6-A3.6.3, wherein the corrector is configured to operate in a Cc correction mode and a bypass mode.

A3.6.4.1. The electrostatic mirror Cc corrector of paragraph A3.6.4, wherein when the corrector is operating in the Cc correction mode, the electron beam is reflected by the first electrostatic electron mirror and the second electrostatic electron mirror.

A3.6.4.2. The electrostatic mirror Cc corrector of any of paragraphs A3.6.4-A3.6.4.1, wherein when the corrector is operating in the bypass mode, the electron beam is deflected by the first set of deflectors and the second set of deflectors such that the electron beam is not reflected by the first electrostatic electron mirror and the second electrostatic electron mirror.

A3.6.4.3. The electrostatic mirror Cc corrector of any of paragraphs A3.6.4-A3.6.4.2, wherein the electron beam exits the corrector along a same beam path whether it is operating in the Cc correction mode or the bypass mode.

A3.7. The electrostatic mirror Cc corrector of any of paragraphs A3.7-A3.6.4.3, wherein the first electrostatic electron mirror and the second electrostatic electron mirror use symmetry to correct 2-fold aberrations.

A3.7.1. The electrostatic mirror Cc corrector of paragraph A3.7, wherein the first electrostatic electron mirror applies a first 2-fold aberration to the electron beam in x direction, and the second electrostatic electron mirror applies a first 2-fold aberration to the electron beam in a y direction.

A3.7.1.1. The electrostatic mirror Cc corrector of paragraph A3.7.1, wherein the first aberration and the second aberration combine to corrector each other.

A3.7.2. The electrostatic mirror Cc corrector of any of paragraphs A3.7-A3.7.1.1, wherein the first electrostatic electron mirror applies a first 2-fold aberration to the electron beam in a first direction, and the second electrostatic electron mirror applies a first 2-fold aberration to the electron beam in a perpendicular direction such that the first aberration and the second aberration combine to corrector each other.

A3.7.2.1. The electrostatic mirror Cc corrector of paragraph A3.7.2, wherein the initial beam path, the reflected beam path, and the exit beam path are not in the same plane.

A4. The electrostatic mirror Cc corrector of any of paragraphs A1-A3.7.2.1, wherein the corrector further comprises at least one more additional electrostatic electron mirror, each of the additional electrostatic electron mirrors comprising a corresponding additional multipole.

A4.1. The electrostatic mirror Cc corrector of paragraph A4, wherein the corrector comprises four electrostatic mirrors.

A4.2. The electrostatic mirror Cc corrector of any of paragraphs A4-A4.1, wherein the first electrostatic electron mirror and the second electrostatic electron mirror are configured to operate in a reflective mode and a transmission mode.

A4.2.1. The electrostatic mirror Cc corrector of paragraph A4.2, wherein the first electrostatic electron mirror and the second electrostatic electron mirror reflect the electron beam when operating in the reflective mode, A4.2.2. The electrostatic mirror Cc corrector of any of paragraphs A4-A4.2.1, wherein the first electrostatic electron mirror and the second electrostatic electron mirror allow the electron beam to travel without reflection when operating in the transmission mode.

A4.2.3. The electrostatic mirror Cc corrector of any of paragraphs A4-A4.2.2, wherein when operating in the reflective mode the first electrostatic electron mirror reflects the electron beam to a first reflected beam path such that the electron beam is incident on a third electrostatic electron mirror A4.2.3.1. The electrostatic mirror Cc corrector of paragraph A4-A4.2.3, wherein the third electrostatic electron mirror reflects the electron beam to a second reflected beam path such that the electron beam may be deflected by a first set of deflectors.

A4.2.3.2. The electrostatic mirror Cc corrector of any of paragraphs A4-A4.4.2.3.1, wherein the first set of deflectors deflect the electron beam to a first deflected beam path such that the electron beam may be deflected by a second set of deflectors.

A4.2.3.3. The electrostatic mirror Cc corrector of any of paragraphs A4-A4.2.3.2, wherein the second set of deflectors deflect the electron beam to a second deflected beam path such that the electron beam is incident on a fourth electrostatic electron mirror.

A4.2.3.4. The electrostatic mirror Cc corrector of any of paragraphs A4-A4.2.3.2, wherein the fourth electrostatic electron mirror reflects the electron beam to a third reflected beam path such that the electron beam incident on the second electrostatic electron mirror.

A4.3. The electrostatic mirror Cc corrector of any of paragraphs A4-A4.2.3.4, wherein at least one lens is positioned between the first set of deflectors and the second set of deflectors.

B1. A charged particle system, the system comprising: a sample holder configured to hold a sample; a source configured to emit a charged particle beam towards a sample; an electrostatic mirror chromatic aberration (Cc) corrector of any of paragraphs A1-A4.3; a focusing column configured to direct the charged particle beam to be incident on the sample; and one or more detectors configured to detect emissions resultant from the charged particle beam being incident on the sample.

C1. Use of an electrostatic mirror chromatic aberration (Cc) corrector of any of paragraphs A1-A4.3.

D1. Use of the charged particle system of paragraph B1.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "determine," "identify," "produce," and "provide" to describe the disclosed methods. These terms are high-level abstractions of the actual operations that are performed. The actual operations that correspond to these terms will vary depending on the particular implementation and are readily discernible by one of ordinary skill in the art.

What is claimed is:

1. An electrostatic mirror chromatic aberration (Cc) corrector, the corrector comprising:

an electrostatic electron mirror comprising an electrostatic multipole, the electrostatic multipole positioned at or near a mirror plane of the electrostatic electron mirror; and wherein the electrostatic electron mirror is positioned within the corrector such that, when the corrector is in use, an electron beam passing through the corrector is not incident on the electrostatic electron mirror along a central mirror axis of the mirror.

2. The electrostatic mirror Cc corrector of claim 1, wherein the mirror object distance of the electrostatic mirror is equal to the mirror image distance of the electrostatic mirror, such that the electrostatic mirror applies no dispersion or coma aberration to the electron beam.

3. The electrostatic mirror Cc corrector of claim 1, wherein the mirror axial potential of the electrostatic mirror is specifically shaped such that the electrostatic mirror induces no chromatic astigmatism to the electron beam.

4. The electrostatic mirror Cc corrector of claim 1, wherein the electrostatic mirror Cc corrector is positioned upstream of an accelerator when used in a charged particle system, such that a chromatic aberration of the electron beam is corrected before the electron beam is accelerated by the accelerator.

5. The electrostatic mirror Cc corrector of claim 1, wherein the electrostatic mirror CC corrector does not comprise a beam splitter.

6. The electrostatic mirror Cc corrector of claim 1, wherein the electrostatic electron mirror comprises a MEMS device.

7. The electrostatic mirror Cc corrector of claim 1, wherein the electrostatic electron mirror is a pancake multipole mirror.

8. The electrostatic mirror Cc corrector of claim 1, wherein the electrostatic multipole is a quadrupole, and the quadrupole applies a stigmatism to the electron beam without disturbing the symmetry between the object side and image side of the electrostatic electron mirror.

9. The electrostatic mirror Cc corrector of claim 1, wherein the diameter of the electrostatic electron mirror is 3 mm or less.

10. The electrostatic mirror Cc corrector of claim 1, wherein the electrostatic electron mirror is a first electrostatic electron mirror, the multipole is a first multipole, and the corrector further comprises a second electrostatic electron mirror comprising a second electrostatic multipole.

11. The electrostatic mirror Cc corrector of claim 10, wherein the second electrostatic electron mirror is positioned within the corrector such that, when the corrector is in use, the electron beam passing through the corrector is not incident on the second electrostatic electron mirror along the central mirror axis of the second electrostatic electron mirror.

12. The electrostatic mirror Cc corrector of claim 10, wherein the first electrostatic electron mirror and the second electrostatic electron mirror use symmetry to correct 2-fold aberrations.

13. The electrostatic mirror Cc corrector of claim 12, wherein the first electrostatic electron mirror applies a first 2-fold aberration to the electron beam in a first direction, and the second electrostatic electron mirror applies a second 2-fold aberration to the electron beam in a perpendicular direction such that the first aberration and the second aberration combine to correct each other.

14. The electrostatic mirror Cc corrector of claim 1, wherein the corrector further comprises a first set of deflectors and a second set of deflectors, wherein:

the first set of deflectors is configured to selectively deflect the electron beam away from a first beam path where it would strike the first electrostatic electron mirror and to a second beam path where the electron beam travels to the second set of deflectors; and the second set of deflectors are configured to selectively deflect the electron beam away from the second beam path and to a third beam path.

15. The electrostatic mirror Cc corrector of claim 14, wherein when the corrector is operating in a Cc correction mode, the electron beam is reflected by the first electrostatic electron mirror and the second electrostatic electron mirror, and when the corrector is operating in a bypass mode, the electron beam is deflected by the first set of deflectors and the second set of deflectors such that the electron beam is not reflected by the first electrostatic electron mirror and the second electrostatic electron mirror.

16. The electrostatic mirror Cc corrector of claim 15, wherein the electron beam exits the corrector along a same beam path whether it is operating in the Cc correction mode or the bypass mode.

17. The electrostatic mirror Cc corrector of claim 1, wherein the mirror plane of the electrostatic electron mirror corresponds to a plane at or near the surface of a pancake multipole.

18. A charged particle system, the system comprising:
a sample holder configured to hold a sample;
a source configured to emit a charged particle beam towards a sample;
an electrostatic mirror chromatic aberration (Cc) corrector, the corrector comprising:
an electrostatic electron mirror comprising an electrostatic multipole, the electrostatic multipole being positioned in a mirror plane of the electrostatic electron mirror; and
wherein the electrostatic electron mirror is positioned within the corrector such that, when the corrector is in use, an electron beam passing through the corrector is not incident on the electrostatic electron mirror along a central mirror axis of the mirror;
a focusing column configured to direct the charged particle beam to be incident on the sample; and
one or more detectors configured to detect emissions resultant from the charged particle beam being incident on the sample.

19. The charged particle system of claim 18, wherein the mirror object distance of the electrostatic mirror is equal to the mirror image distance of the electrostatic mirror, such that the electrostatic mirror applies no dispersion or coma aberration to the electron beam.

20. The charged particle system of claim 18, wherein the electrostatic electron mirror is a first electrostatic electron mirror, the electrostatic multipole is a first electrostatic multipole, the corrector further comprises a second electrostatic electron mirror comprising a second electrostatic multipole, and wherein the first electrostatic electron mirror and the second electrostatic electron mirror use symmetry to correct 2-fold aberrations.

* * * * *